United States Patent
Kato et al.

(10) Patent No.: US 7,990,159 B2
(45) Date of Patent: Aug. 2, 2011

(54) POTENTIAL MEASUREMENT APPARATUS AND IMAGE FORMING APPARATUS

(75) Inventors: Kazuhiko Kato, Tokyo (JP); Toshiyuki Ogawa, Yokohama (JP); Yoshitaka Zaitsu, Ichikawa (JP); Takashi Ushijima, Nagoya (JP); Kaoru Noguchi, Tokyo (JP); Atsushi Kandori, Ebina (JP); Futoshi Hirose, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 211 days.

(21) Appl. No.: 12/521,081

(22) PCT Filed: Jan. 28, 2008

(86) PCT No.: PCT/JP2008/051693
§ 371 (c)(1),
(2), (4) Date: Jun. 24, 2009

(87) PCT Pub. No.: WO2008/093852
PCT Pub. Date: Aug. 7, 2008

(65) Prior Publication Data
US 2010/0019779 A1    Jan. 28, 2010

(30) Foreign Application Priority Data
Jan. 29, 2007  (JP) ................................ 2007-018599

(51) Int. Cl.
*G01R 27/26* (2006.01)
(52) U.S. Cl. .......................... 324/661; 324/457; 324/72
(58) Field of Classification Search .................. None
See application file for complete search history.

(56) References Cited

U.S. PATENT DOCUMENTS
4,205,267 A  5/1980 Williams
4,894,607 A * 1/1990 Kumada .......................... 324/96
(Continued)

FOREIGN PATENT DOCUMENTS

| | | |
|---|---|---|
| EP | 1003044 A2 | 5/2000 |
| JP | 62-110372 A | 5/1987 |
| JP | 7-244103 A | 9/1995 |
| JP | 2000-147036 A | 5/2000 |
| WO | 03/033993 A1 | 4/2003 |

OTHER PUBLICATIONS

International Search Report and Written Opinion dated Jul. 24, 2008 in International Application No. PCT/2008/051693, filed Jan. 28, 2008.

(Continued)

*Primary Examiner* — Huy Phan
*Assistant Examiner* — Arleen M Vazquez
(74) *Attorney, Agent, or Firm* — Fitzpatrick, Cella, Harper & Scinto

(57) ABSTRACT

A potential measurement apparatus for measuring a surface potential of an object of measurement detects a change in electric charge induced at a detection electrode due to electrostatic induction by changing a distance between the detection electrode and the object of measurement in accordance with a predetermined period, using a neutral distance as reference, as a signal representing a change in electric current. The potential measurement apparatus includes a first detection unit for detecting a signal representing a fundamental period of the change in electric current and a signal representing a second harmonic period, a second detection unit for detecting information representing a capacitance between the detection electrode at the neutral distance and the object of measurement and an arithmetic unit for computationally obtaining information on the surface potential of the object of measurement, with eliminating an influence of the neutral distance and the capacitance, according to an outcome of detection of the first detection unit and an outcome of detection of the second detection unit.

3 Claims, 3 Drawing Sheets

U.S. PATENT DOCUMENTS

| | | | |
|---|---|---|---|
| 5,212,451 | A | 5/1993 | Werner, Jr. |
| 7,242,882 | B2 | 7/2007 | Ichimura et al. |
| 7,265,554 | B2 | 9/2007 | Ichimura et al. |
| 7,274,193 | B2 | 9/2007 | Yasuda et al. |
| 2003/0057977 | A1 | 3/2003 | Werner, Jr. et al. |
| 2003/0175945 | A1 | 9/2003 | Thompson et al. |
| 2006/0267593 | A1* | 11/2006 | Ichimura et al. .............. 324/452 |
| 2007/0065169 | A1 | 3/2007 | Kandori et al. |
| 2008/0112717 | A1 | 5/2008 | Zaitsu et al. |
| 2008/0116897 | A1 | 5/2008 | Ushijima et al. |
| 2008/0122454 | A1* | 5/2008 | Kato .............................. 324/661 |

OTHER PUBLICATIONS

P.S. Riehl, et al., "Microsystems for Electrostatic Sensing", Reg. ID. 1040564878, (Nov. 2002).

International Preliminary Report on Patentability dated Aug. 13, 2009 in International Application No. PCT/2008/051693, filed Jan. 28, 2008.

* cited by examiner

POTENTIAL MEASUREMENT APPARATUS AND IMAGE FORMING APPARATUS

TECHNICAL FIELD

The present invention relates to a potential measurement apparatus that can be used for measuring the surface potential and the charged quantity of electricity of an object of measurement by changing the distance between the detection electrode of the apparatus and the object of measurement and also to an image forming apparatus using the same.

BACKGROUND ART

The photosensitive drum surface of an image forming apparatus having a photosensitive drum and designed to form an image by electrophotography is required to be electrified so as to show an appropriate (typically uniform) potential distribution in any environment in order to constantly produce images of a stabilized quality. For this reason, a functional device for measuring the electric potential of the photosensitive drum surface by means of a potential measurement apparatus and feedback-controlling the potential of the photosensitive drum surface so as to keep the potential uniform, utilizing the outcome of the measurement, is generally mounted in the image forming apparatus.

Potential measurement apparatus to be used for such applications are required to have a functional feature of measuring the surface potential of an object of measurement without contacting the object. This is because the potential distribution of the photosensitive drum surface becomes non-uniform and a disturbed image can be formed when the potential measurement apparatus touches the photosensitive drum surface.

A technique of minutely fluctuating the capacitance between the object of measurement and the detection electrode arranged vis-à-vis the object of measurement to obtain a current signal having an amplitude proportional to the surface potential of the object of measurement is utilized for the principle of measurement of contactless type potential measurement apparatus.

Now, the principle of potential measurement of contactless type potential measurement apparatus will be described below.

A quantity of electricity Q that is proportional to the surface potential V of the object of measurement is induced on the detection electrode by the electric field generated between the surface of the object of measurement having a certain electric potential and the detection electrode contained in the potential measurement apparatus.

The relationship between Q and V is expressed by formula (1) below:

$$Q = CV \quad (1)$$

where C is the capacitance between the detection electrode and the surface of the object of measurement. From the formula (1), it will be seen that the surface potential of the object of measurement can be obtained by measuring the quantity of electricity Q induced on the detection electrode.

However, it is actually difficult to directly measure the quantity of electricity Q that is induced on the detection electrode quickly and accurately. For this reason, a technique of detecting the surface potential of the object of measurement by periodically changing the capacitance C between the detection electrode and the object of measurement and observing the AC signal generated at the detection electrode is employed as practical measurement method.

That the above-described technique can provide the surface potential of the object of measurement will be shown below. To express the capacitance C as a function of time t, the AC signal and hence the potential detection signal current i generated at the detection electrode is expressed by formula (2) below on the basis of the formula (1) because the potential detection signal current i is the time differential value of the quantity of electricity Q induced at the detection electrode.

$$i(t) = dQ/dt = d(CV)/dt \quad (2)$$

When the changing rate of the surface potential V of the object of measurement is sufficiently small relative to the changing rate of the capacitance C, V can be regarded as constant for the differentiating time dt. Therefore, the formula (2) can be expressed as formula (3) below.

$$i(t) = dQ(t)/dt = V \cdot dC(t)/dt \quad (3)$$

From the formula (3), the surface potential of the object of measurement can be obtained by measuring the amplitude of the AC signal because the magnitude of the potential detection signal current i generated at the detection electrode is expressed as a linear function of the surface potential V of the object of measurement. Additionally, from the formula (3), if the changing rate of the capacitance remains same, the magnitude of the AC signal relative to the surface potential of the object of measurement and hence the sensitivity of the potential measurement apparatus is proportional to the changing rate of the capacitance.

As described above, when measuring the electric potential V of the surface of the object of measurement, the magnitude of the capacity C between the detection electrode and the object of measurement is desirably periodically modulated in order to accurately measure the quantity of the electric charge Q that appears on the detection electrode. A technique that can be used to modulate the capacity C is to periodically change the distance x between the detection electrode and the object of measurement. A unit that can be used to periodically change the distance between the detection electrode and the surface of the object of measurement is to arrange the detection electrode at the front end of a vibrating body and vibrate the vibrating body in a direction perpendicular to the surface of the object of measurement (see the embodiment that will be described hereinafter).

The distance x between the detection electrode and the object of measurement is to be periodically changed because the capacitance C between the detection electrode and the surface of the object of measurement illustrates a relationship that is approximately expressed by formula (4) below:

$$C = A \cdot S/x \quad (4),$$

where A is the constant of proportion specific to the dielectric constant of the substance of the object of measurement, S is the area of the detection electrode and x is the distance between the detection electrode and the surface of the object of measurement. From the formula (4), it will be seen that the capacitance C is changed periodically when the distance x is changed periodically. Note that A and S are constant.

However, a potential measurement apparatus adapted to detect as an electric current the change in the electric charge induced at the detection electrode by electrostatic induction is sensitive to the distance that operates as reference for the object of measurement and the detection electrode (the neutral distance that operates as reference relative to the change) and the distance strongly influences the accuracy of measurement and the resolution. While the distance from the detection electrode to the object of measurement changes periodically, the distance between the object of measurement and the detection electrode when the detection electrode is located at the neutral position that operates as reference is referred to as neutral distance in this specification. Thus, the neutral distance is a distance that needs to be held to a constant value regardless of change of the distance between the detection electrode and the surface of the object of measurement when the vibrating body is actually vibrating. While the neutral distance ideally needs to be held to a constant value, the neutral distance fluctuates in reality due to the vibrations of the image forming apparatus in operation, the eccentric rotation of the photosensitive drum and the change with time or due to heat of the distances among the components of the image forming apparatus. As the neutral distance changes, the measured value of the potential measurement apparatus is shifted from the true value. In short, the measured potential fluctuates depending on the change in the neutral distance.

Therefore, known potential measurement apparatus employ a booster circuit section for suppressing the distance dependency relative to the object of measurement for the purpose of feedback control. With a typical configuration of known potential measurement apparatus, information on the potential of the object of measurement is sensed by means of a sensing circuit including a detection electrode and subsequently the signal is amplified by means of an amplifying circuit. Then, the signal obtained from the amplifying circuit is detected and boosted by way of a detecting circuit and a boosting circuit. The boosted voltage is then used as feedback voltage and applied to the sensing circuit by way of a shield line. Then, the equilibrium point with the potential of the object of measurement is determined and the voltage applied to the sensing circuit is used as the potential of the object of measurement to suppress the distance dependency (see Japanese Patent Application Laid-Open No. 07-244103).

DISCLOSURE OF THE INVENTION

However, known potential measurement apparatus are poorly responsive and are not adapted to high-speed measurements because the apparatus employ a high voltage power source for the purpose of suppressing the dependency on the distance between the object of measurement and the detection electrode and it is subjected to feedback control. Note that the distance x and the capacitance C have a relationship defined by the above formula (4) and hence suppressing the dependency on the distance is equivalent to suppressing the dependency on the capacitance.

Additionally, with known potential measurement apparatus, the electric potential of the entire detector including the detection electrode influences the measurement and hence the spatial resolution of measurement becomes coarse. Thus, it is difficult for known potential measurement apparatus to finely measure the electric potential of the object of measurement.

In view of the above-identified problem, the present invention provides a potential measurement apparatus for measuring a surface potential of an object of measurement, which is capable of detecting a change in electric charge induced at a detection electrode due to electrostatic induction by changing a distance between the detection electrode and the object of measurement in accordance with a predetermined period, using a neutral distance as reference. The potential measurement apparatus includes a first detection unit, a second detection unit, and an arithmetic unit. The first detection unit detects a signal representing a fundamental period of the change in electric current and a signal representing a second harmonic period, which may be referred to a double period of the fundamental period. The second detection unit detects information representing a capacitance between the detection electrode at the neutral distance and the object of measurement, which may be simply referred to as information representing the neutral distance.

The arithmetic unit computationally obtains a value of surface potential of the object of measurement, with suppressing a component attributable to an influence of the neutral distance and the capacitance according to an outcome of detection of the first detection unit and an outcome of detection of the second detection unit.

In another aspect of the present invention, there is provided an image forming apparatus including: a potential measurement apparatus as defined above; a signal processing unit for processing the output signal of the potential measurement apparatus; and an image forming unit. The potential measurement apparatus is arranged vis-à-vis the image forming unit, which is the object of potential measurement, and the image forming unit controls image formation, using the outcome of the signal processing operation of the signal processing unit.

The potential measurement apparatus of the present invention arithmetically processes a plurality of outcomes of detection of the signal representing the fundamental period, the signal representing the double period of the fundamental period and the information on the capacitance and measures the surface potential of the object of measurement without depending on the distance between the object of measurement and the detection electrode. Therefore, unlike the conventional art, the potential measurement apparatus according to the present invention does not need to use a high voltage power source as component. Hence, the potential measurement apparatus according to the present invention shows a relatively quick response and can improve the accuracy and the spatial resolution of measurement.

Further features of the present invention will become apparent from the following description of exemplary embodiments with reference to the attached drawings.

BEST MODE FOR CARRYING OUT THE INVENTION

Figure 1:
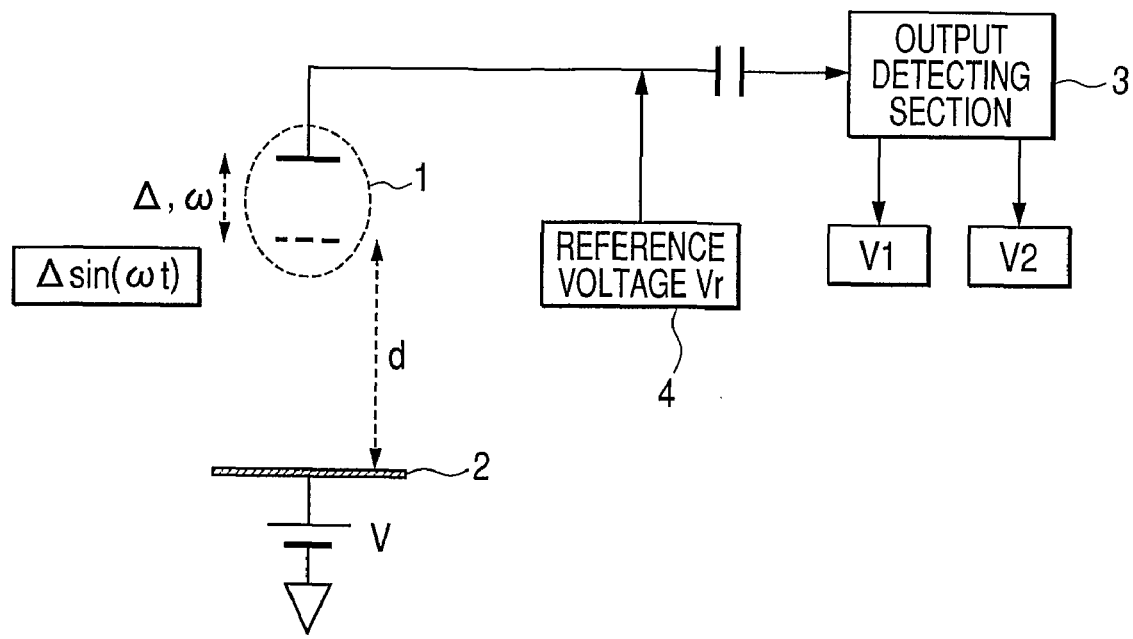
FIG. 1 is a schematic block diagram of the first embodiment of the present invention, illustrating the conceptual configuration thereof.

Now, the first embodiment of the present invention will be described along with the underlying principle of the present invention. FIG. 1 is a schematic block diagram of the first embodiment of the present invention, illustrating the conceptual configuration thereof. With the arrangement of FIG. 1, an induction charge is induced at the detection electrode 1 due to the influence of the potential of the object of measurement 2. Assume that the neutral distance between the object of measurement 2 and the detection electrode 1 is d. At the time of a detecting operation, using an arbitrary actuator, the detection electrode 1 is driven to oscillate with a displacement (amplitude) of $\Delta$ and a frequency of $\omega$ relative to the object of measurement 2. In other words, the detection electrode 1 is driven to oscillate in accordance with $\Delta \sin(\omega t)$. Then, the induction charge induced by the detection electrode 1 is made to change and an electric current showing the change flows to the output detecting section 3. In reality, the change in the electric current is subjected to impedance transformation, detection, amplification and rectification by a signal processing unit and detected by the output detecting section 3 as a measurement signal of the surface potential of the object of measurement 2 that is a signal representing the change in the electric current.

Then, when C is expressed as a series of sinusoidal wave functions, using $x=d+\Delta \sin(\omega t)$, by means of the above formula (4), C of the formula (4) can be approximately expressed by a term including $\sin(\omega t)$ and a term including $\sin(2\omega t)$. Therefore, the detection signal current i of the above formula (3) that is obtained by differentiating C with time also have a component including $\sin(\omega t)$ and a component including $\sin(2\omega t)$. Then, when the signal is filtered for separation by frequency and the output (amplitude) of the fundamental frequency ($\omega$) is V1 while the output (amplitude) of the second harmonic frequency ($2\omega$) is V2, the ratio is computationally determined as $\Delta/d$ from the coefficient of the component including $\sin(\omega t)$ and the coefficient of the component including $\sin(2\omega t)$. V1 and V2 are detected by the first detection unit formed by the output detecting section 3 that includes a filter unit for frequency separation.

Figure 3A:
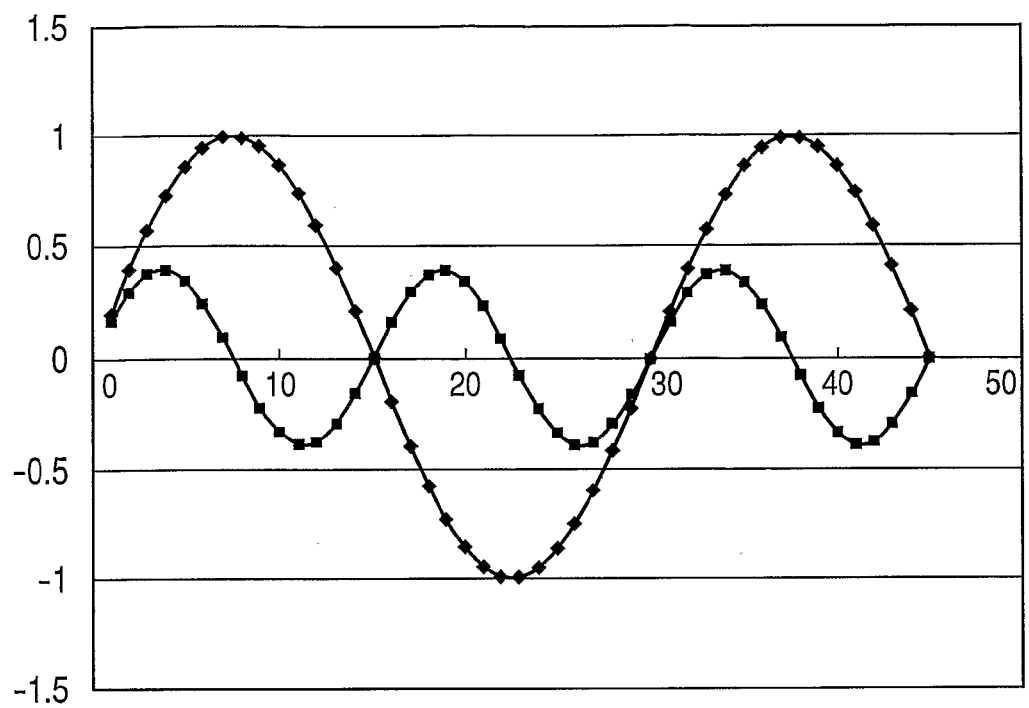
FIGS. 3A and 3B are graphs illustrating the fundamental wave, the second harmonic and the wave obtained by adding the two waves of the electric current from the detection electrode.
Figure 3B:
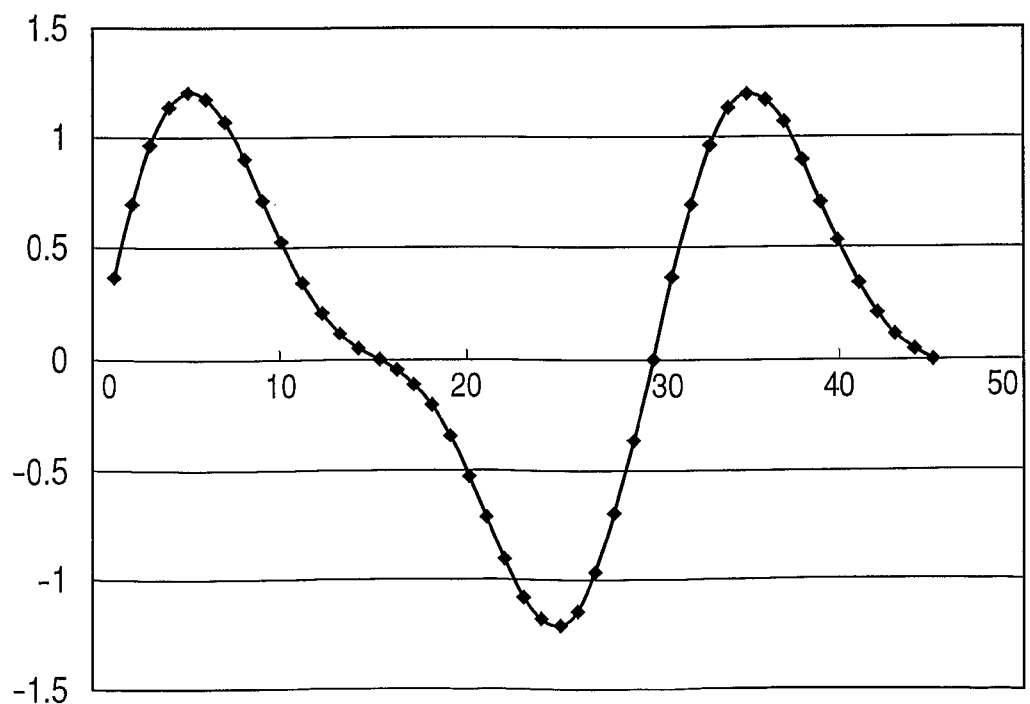

FIGS. 3A and 3B are graphs illustrating signal waveforms. FIG. 3B illustrates the signal waveform obtained by adding the wave of the fundamental frequency and the wave of the second harmonic frequency. The signal obtained from the detection electrode 1 shows the waveform resulting from the addition of the two waves. FIG. 3A illustrates the waveform of V1 and the waveform of V2 obtained by filtering the signal of FIG. 3B to separate the fundamental wave and the second harmonic by means of a filter. In FIGS. 3A and 3B, the horizontal axis indicates phase while the vertical axis indicates the amplitude/intensity.

Thus, the relationship of the outputs of V1 and V2, the displacement $\Delta$ of the actuator and the neutral distance between the object of measurement 2 and the detection electrode 1 is expressed by the formula shown below for the above-described reason.

$$\Delta/d = V2/V1 \quad (5)$$

From the formula (3) above, the relationship of the potential to be measured V and the output of the fundamental frequency V1 is expressed by the formula shown below:

$$V1 = C \times V \times \Delta \times \omega / d \quad (6),$$

where C is the capacitance (at the neutral distance) between the detection electrode 1 and the object of measurement 2.

Therefore, from the formulas (5) and (6), the potential V of the object of measurement 2 is expressed by the formula shown below.

$$V = (V1 \times V1)/(V2 \times C \times \omega) \quad (7).$$

If the voltage applied to the detection electrode 1 by reference power source 4 is Vr and the output of the fundamental frequency and that of the second harmonic frequency that are detected when the detection electrode 1 is oscillated in the above described manner are V1r and V2r, the formula shown below is obtained as in the case of the formula (7). 0

$$V + Vr = (V1r \times V1r)/(V2r \times C \times \omega) \quad (8)$$

V1r and V2r are detected by the second detection unit that is formed by the output detecting section 3 including the filter unit for frequency separation and the reference power source 4. V1r and V2r constitute information showing the capacitance between the detection electrode 1 and the object of measurement 2 at the neutral distance (and hence information that indicates the neutral distance).

From the above relations, the electric potential V of the object of measurement 2 is expressed by the formula shown below that does not include C.

$$V = Vr/((V1r/V1)^2 \times (V2/V2r) - 1) \quad (9)$$

The value of V is computationally determined by an arithmetic unit such as a microprocessor that operates for arithmetic processes according to the detection outcome of the first detection unit and the detection outcome of the second detection unit.

Thus, when the detection electrode 1 is driven to oscillate, the electric potential of the object of measurement 2 can be measured only from the detection outcome (voltage) of the first detection unit and the detection outcome (voltage) of the second detection unit regardless of C and d. In other words, even if the distance that operates as reference for the object of measurement and the detection electrode (the neutral distance that operates as reference for changes) fluctuates, the electric potential can be measured accurately without being influenced by the fluctuations.

The above-described principle is the same as the principle of computationally determining the electric potential of the object of measurement 2 only by means of the voltage that can be measured by the output detecting section 3, which is the first detection unit, by determining C or d by means of the oscillation circuit of the second detecting unit and eliminating C in the above formula (7).

Figure 2:
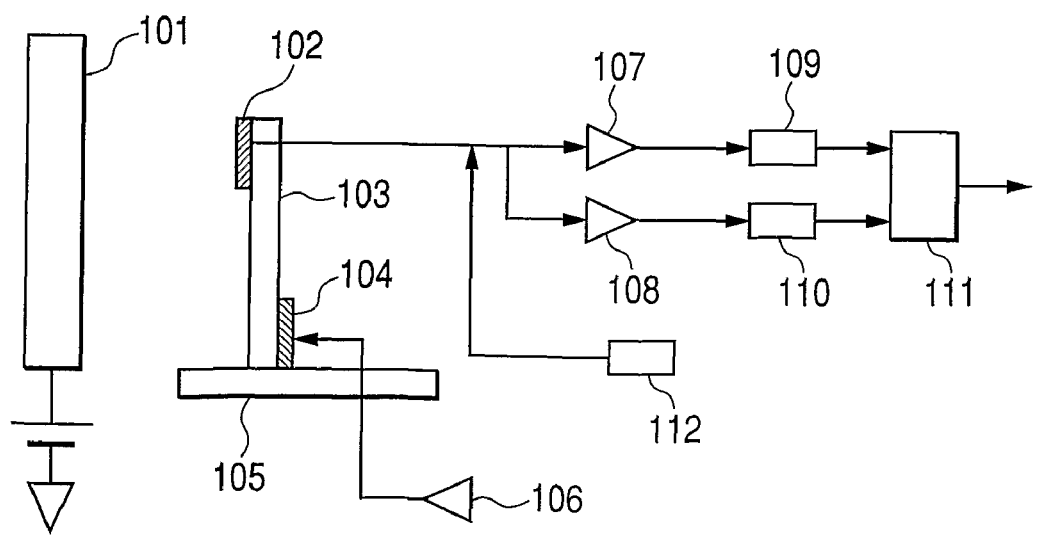
FIG. 2 is a schematic circuit diagram of the first embodiment, illustrating the configuration thereof in greater detail.

FIG. 2 is a schematic circuit diagram of the first embodiment, illustrating the configuration thereof in greater detail. Again, an electric charge is induced at the detection electrode 102 by electrostatic induction from the object of measurement 101. In FIG. 2, a piezoelectric device 104 is applied to a base position of cantilever 103 carrying the detection electrode 102 in order to drive the detection electrode 102 to oscillate with a predetermined constant period. The base of the cantilever 103 is rigidly anchored to a stationary table 105. The piezoelectric device 104 is driven to operate by an oscillator 106.

With this arrangement, the oscillation of the cantilever 103 can be sustained by the resonance frequency and the detection electrode 102 can be stably driven with a predetermined constant frequency and a predetermined constant amplitude. The change in the electric current from the detection electrode 102 sorted by a fundamental frequency filter 107 and a second harmonic frequency filter 108 into respective frequency components, which are then converted into digital values by respective analog/digital converters 109 and 110. The digital values are input to microprocessor 111 and stored there.

On the other hand, reference power source 112 is driven to apply a reference voltage to the detection electrode 102 while the detection electrode 102 is stably driven to oscillate with a constant frequency and a constant amplitude. Then, the potential between the detection electrode 102 and the object of measurement 101 is changed. Again, the output of the fundamental frequency filter 107 and the output of the second harmonic frequency filter 108 are converted into digital values by the respective analog/digital converters 109 and 110 and the digital values are input to the microprocessor 111 and stored there.

Then, the microprocessor 111 executes an arithmetic process according to the above formula (9), using the detection outcomes stored in the microprocessor so that the electric potential of the object of measurement 101 can be measured without relying on C and d. Thus, if the distance between the object of measurement and the detection electrode that operates as reference (the neutral distance that operates as reference for changes) fluctuates, the electric potential can be measured accurately without being influenced by the fluctuations.

A diaphragm such as the above described cantilever 103 can be driven to oscillate not only by the drive force produced by a piezoelectric device but also by some other drive force such as electromagnetic force or electrostatic force. When electromagnetic force is employed, a magnetic body is arranged on the diaphragm and an electromagnetic coil is arranged at the anchoring side of the diaphragm. Then, the diaphragm is driven to oscillate with a desired period as a drive current is flown from a drive signal source to the electromagnetic coil. When, on the other hand, electrostatic force is employed, an electrode is typically arranged on the diaphragm and an opposite electrode is arranged at a position located at the anchoring side near the former electrode. Then, the diaphragm is driven to oscillate with a desired period as a drive current is flown from a drive signal source to the opposite electrode.

Figure 4:
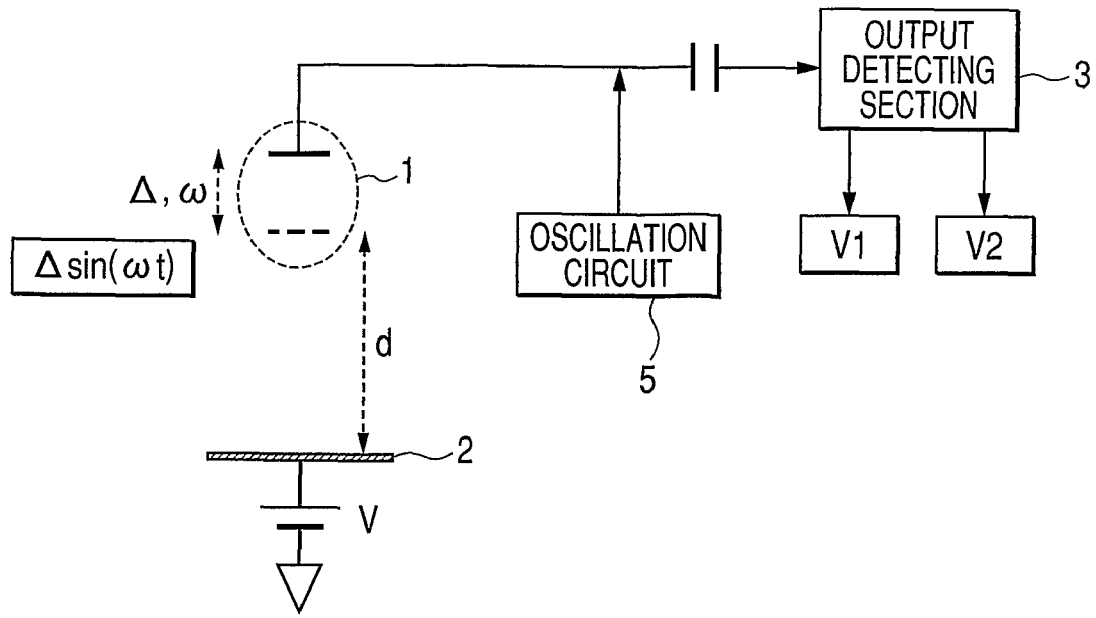
FIG. 4 is a schematic block diagram of the second embodiment of the present invention, illustrating the conceptual configuration thereof.

FIG. 4 is a schematic block diagram of the second embodiment of the present invention, illustrating the conceptual configuration thereof. The second embodiment differs from the first embodiment in that the reference power source 4 of the first embodiment is replaced by an oscillation circuit 5. Otherwise, the configuration of the second embodiment is the same as that of the first embodiment.

The oscillation circuit 5 operates as the second detection unit and includes a resonance circuit having a capacitance (C) formed between the detection electrode 1 and the object of measurement 2 illustrating the neutral distance, a known inductance (L) and a frequency-variable power source. The resonance circuit may typically be a series resonance circuit or a parallel resonance circuit. The frequency of the power source is changed for the series or parallel resonance circuit and the frequency (f) at the position where a voltage is generated at the time of resonance between the terminals of the inductance or the terminals of the parallel circuit is detected. Then, the capacitance C can be computationally determined from the relation of $f=1/(2\pi(LC)^{1/2})$. At this time, the detection electrode 1 is not driven to oscillate but held stationary at the neutral position. For computationally determining the capacitance C, the frequency (f) is output from a unit for controlling the frequency-variable power source of the oscillation circuit 5 or a control unit including the unit for detecting the voltage at the time of resonance and the frequency (f) at that time to a microprocessor or some arithmetic unit, which executes the process of computationally determining the capacitance C.

Thus, C or d is determined by means of the oscillation circuit 5 that operates as the second detection unit and C is eliminated from the above formula (7). Then, as a result, the electric potential of the object of measurement 2 can be computationally determined by means of an arithmetic unit such as a microprocessor by using only the detection outcome (voltage) measured separately by the output detecting section 3 that operates as the first detection unit.

Thus, as described above, the capacitance C can be observed by measuring the oscillation frequency, using the capacitance formed by the detection electrode 1 and the object of measurement 2 as part of the oscillation circuit. Then, the component influenced by the distance or the capacitance can be suppressed by means of an arithmetic process using the capacitance C.

A resonance bridge that is a 4-arm bridge for measuring the capacitance formed between the detection electrode 1 and the object of measurement 2 can be used for the oscillation circuit. The capacitance (C) and the known inductance (L) connected in series or in parallel are then connected to a frequency-variable power source for the resonance bridge. In this case again, the capacitance C can be computationally determined from the relation of $f=1/(2\pi(LC)^{1/2})$ by detecting the frequency (f) with which resonance take place.

Now, the third embodiment of the present invention will be described below. This embodiment is an image forming apparatus using a potential measurement apparatus according to the present invention.

Figure 5:
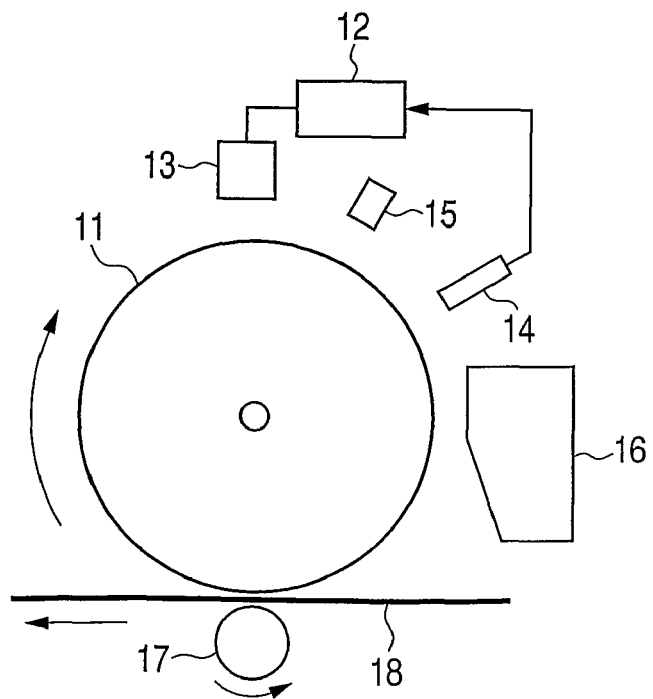
FIG. 5 is a schematic block diagram of the third embodiment of the present invention, which is an image forming apparatus, illustrating the configuration thereof.

FIG. 5 is a schematic block diagram of the image forming apparatus of the third embodiment of the invention, illustrating the configuration thereof. As illustrated in FIG. 5, a charger 13 that can be controlled by a charger control unit 12, a potential measurement apparatus 14 according to the present invention, an exposure unit 15 and a developer supply unit 16 are arranged around a photosensitive drum 11. The mechanism for controlling the charged quantity of electricity of the photosensitive drum 11 is formed by the charger control unit 12, the charger 13 and the potential measurement apparatus 14 according to the present invention and the charger control unit 12 is connected to the charger 13, while the potential measurement apparatus 14 according to the present invention is connected to the charger control unit 12.

Now, the basic operation of this embodiment of image forming apparatus will be described below.

The surface of the photosensitive drum 11 is electrically charged by the charger 13 and the surface of the photosensitive drum 11 is exposed to light by the exposure unit 15 to produce a latent image. Then, the latent image is developed as developer is made to adhere to the latent image by the developer supply unit 16. The developed image is then transferred onto a printing object 18 sandwiched between a printing object feed unit 17 and the photosensitive drum 11 and subsequently the developer on the printing object 18 is made to adhere rigidly. An image is formed on the printing object 18 by way of the above steps. With the above described arrangement, the charger control unit 12 operates as signal processing unit and the charger 13, the exposure unit 15 and the photosensitive drum 11 operate as image forming unit.

Now, the principle of operation of the mechanism for controlling the charged quantity of electricity of the photosensitive drum 11 of the above described arrangement will be described below. The potential measurement apparatus 14 according to the present invention measures the surface potential of the electrically charged photosensitive drum 11 and outputs a signal representing the surface potential of the photosensitive drum 11 to the charger control unit 12. The charger control unit 12 operates to feedback-control the charged voltage of the charger 13 based on the signal representing the surface potential of the photosensitive drum 11 so as to make the surface potential of the electrically charged photosensitive drum 11 illustrate a predetermined potential level. As a result, the photosensitive drum 11 is stably charged and an image is stably formed.

In this embodiment including a high performance potential measurement apparatus 14 according to the present invention that suppresses the distance dependency as described above, the charger control unit 12 that is a signal processing unit for processing the output signal of the potential measurement apparatus 14 and an image forming unit, the image forming unit controls the image forming operation according to the outcome of the signal processing operation of the charger control unit 12. Thus, the image quality of the formed image can be stabilized on an accurate and stable basis by using a potential measurement apparatus according to the present invention.

This application claims the benefit of Japanese Patent Application No. 2007-018599, filed Jan. 29, 2007, which is hereby incorporated by reference herein in its entirety.

The invention claimed is:

1. A potential measurement apparatus for measuring a surface potential of an object of measurement, which is capable of detecting a change in electric charge induced at an detection electrode due to electrostatic induction by changing a distance between the detection electrode and the object of measurement in accordance with a predetermined period, using a neutral distance as reference, as a signal representing a change in electric current, comprising:
   a first detection unit for detecting a signal representing a fundamental period of the change in electric current and a signal representing a second harmonic period;
   a second detection unit for detecting information representing a capacitance between the detection electrode at the neutral distance and the object of measurement; and
   an arithmetic unit for making calculations according to a detection outcome of the first detection unit and a detection outcome of the second detection unit,
   the arithmetic unit computationally obtaining information on the surface potential of the object of measurement, with suppressing an component attributable to an influence of the neutral distance and the capacitance.

2. The potential measurement apparatus according to claim 1, wherein the second detection unit includes a power source for applying a voltage to the detection electrode, the voltage being different from a voltage applied to the detection electrode at a time of detection by the first detection unit.

3. The potential measurement apparatus according to claim 1, wherein the second detection unit includes an oscillation circuit including a resonance circuit having a capacitance formed between the detection electrode at the neutral distance and the object of measurement, a known inductance and a frequency variable power source.

\* \* \* \* \*